July 31, 1956 R. M. WOOD 2,756,483

JUNCTION FORMING CRUCIBLE

Filed May 11, 1953

INVENTOR
ROBERT M. WOOD
BY Paul S. Martin
ATTORNEY

United States Patent Office 2,756,483

Patented July 31, 1956

2,756,483

JUNCTION FORMING CRUCIBLE

Robert M. Wood, Natick, Mass., assignor to Sylvania Electric Products Inc., a corporation of Massachusetts Application May 11, 1953, Serial No. 354,130

8 Claims. (Cl. 29—25.3)

The present invention relates to the fabrication of so-called junction-type semiconductor devices, such as semiconductor transistors suited for electrical amplification and the like, and in particular to methods and apparatus for producing these devices.

The junction type semiconductor triode as one form of transistor includes a body or slice of semiconductive material having two rectifying junctions separated ideally by a uniform and thin intermediate layer of the semiconductive material. Three separate terminals are provided, one ohmic contact for the intermediate layer of the semiconductor body and respective ohmic connections for the rectifying junctions. Various rather critical and difficult methods have been employed to fabricate such devices, curtailing availability and resulting in fairly high unit costs.

It is within the contemplation of the present invention to obviate the foregoing and other difficulties by the provision of a novel method and simplified apparatus for manufacture of junction-type semiconductor devices, and more particularly for forming transistors having well defined and accurately aligned junctions on opposite sides of a semiconductor body.

In accordance with one aspect of the invention, an assembly crucible is provided. This crucible includes a base member advantageously having a stationary normally vertical abutment against which one face of a slice of semiconductor material may be placed, as and for example, a germanium wafer containing a small amount of donor impurity. Accurate constraining of the semiconductor slice or wafer with opposite faces exposed for the formation of appropriate junctions thereon is accomplished by a gripping member having a further normally vertical abutment urged toward the one abutment by an actuating incline fixed in relation to the stationary abutment. When once in supporting relation to the semiconductor slice, the base and gripping members are arranged to direct pellets or pills to opposite sides of the semiconductor, these pellets being of suitable material for forming rectifying junctions on the semiconductor material, for example, a pure or alloyed acceptor metal. An acceptor is employed where the semiconductor body predominantly contains a donor impurity in the formation of P—N—P junction transistor, and the impurity types are reversed in forming N—P—N junction transistors as is well known. Thereafter, with the pills or pellets resting against the germanium slice at appropriate directly opposite locations, the assembly is heated for a time and at a temperature effective to produce proper bonding of the applied material with the germanium to form rectifying junctions to opposite sides of the semiconductor slice. Melting and alloying of the applied material to the germanium usually occurs, and during cooling, the applied material grows as a crystal extension of the germanium crystalline structure at each junction. In order to complete the P—N—P triode amplifier, optionally in a separate operation, an additional ohmic connection is made to the semiconductor body.

The nature and various features and advantages of the invention will be appreciated by reference to the following illustrative disclosure relating to the formation of P—N—P semiconductor devices. It is to be expressly understood that the invention is equally applicable to the formation of N—P—N triode amplifiers by starting with a slice of semiconductor predominantly containing an acceptor impurity rather than a donor impurity and employing donor materials to form junctions on the opposite sides of the starting slice.

Figure 1:
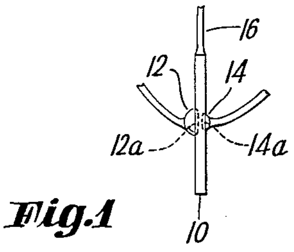
Fig. 1 is a greatly enlarged elevation of a finished semiconductor junction-type triode made by a method and apparatus embodying features of the present invention.

In Fig. 1 there is shown a junction-type semiconductor triode including a semiconductor body 10, opposed alloy terminals 12, 14 adjoining the body at rectifying junctions 12*a*, 14*a* and separated by a thin intermediate layer of the semiconductive body, and an ohmic connection 16 to the semiconductor body 10. When the semiconductor body is initially of N-type material, P-type impurities such as indium and gallium and alloys of these materials with inactive metals are suitable for forming the respective terminals 12, 14. When the body 10 is initially of P-type semiconductor, N-type impurities may be used to form the terminals, such as phosphorous, arsenic, antimony and bismuth.

In these junction-type semiconductor triodes, the separation between the rectifying junctions or barriers 12*a*, 14*a* ideally is to be a minimum and as uniform as possible to obtain good performance at high frequencies. The edge conditions of the outer limits of the respective junctions 12*a*, 14*a* are of special concern, since for best performance these junctions should be of the same shape and should be directly opposite each other. The size of one junction is preferably smaller than the other. With usual circuit connections, the input electrode, for example electrode 14, enhances output current between ohmic connection 16 and the rectifying output electrode 12. There is a certain amount of direct current leakage between the edge of the electrode or terminal 12 and the ohmic connection 16, in the sense that current flows which is unaffected by the input signal current. This leakage should be held to a minimum, but is not critical. However, if there is any waste of control current, that is, current at the input electrode 14 intended to correspondingly control the output current between the electrodes 12 and 16, a loss of signal efficiency results. To avoid this loss, it is therefore desirable that the input junction 14 be made smaller than the output junction 12.

Figure 4:
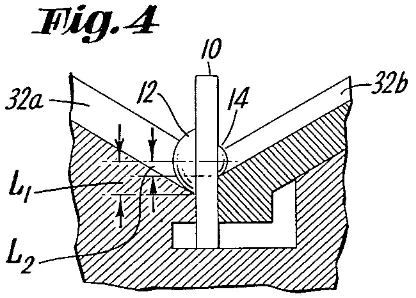
Fig. 4 is an enlarged fragmentary sectional view taken substantially along the line 4—4 of Fig. 2.
Figure 2:
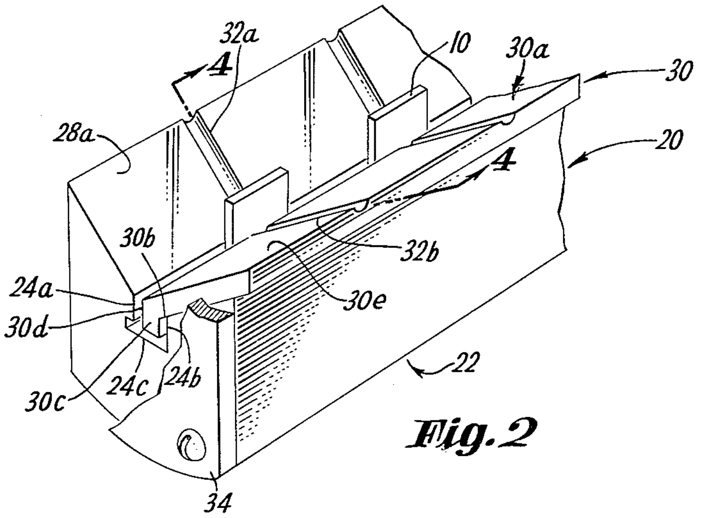
Fig. 2 is a perspective view, partially broken away, showing an assembling and processing crucible for the formation of rectifying junctions in a device of the type illustrated in Fig. 1.
Figure 3:
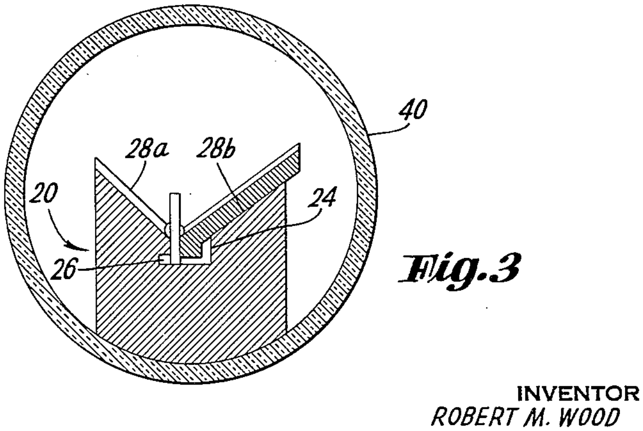
Fig. 3 is a transverse sectional view showing the crucible of Fig. 2 supported in a furnace at a stage of the processing cycle.

The apparatus of the present invention, illustrated in Figs. 2 to 4 inclusive, is provided for forming the respective rectifying junctions on the semiconductor body 10. The apparatus includes a composite assembling and processing crucible, generally designated by the reference numeral 20, which includes a base member and a gripping member, both fabricated of a material inert in relation to the materials being processed at the operating temperatures. Graphite of highest available purity is suitable to avoid introducing contaminating materials and to withstand the treatment temperatures which may exceed 500° C. As seen best in Figs. 3 and 4, the base member 22 includes a median channel 24 having opposed upstanding side walls 24*a*, 24*b* and a base or bottom wall 24*c*. The upstanding channel wall 24*a* is longitudinally undercut contiguous to the bottom wall 24*c*, as indicated at 26, being primarily intended to preclude the accumulation of graphite flakes and chippings immediately beneath the wall 24*a*. The base member 22 is formed with downwardly convergent surfaces 28*a*, 28*b*, that are separated by channel 24.

Resting on the base member 22 is the gripping member 30. This includes a slide section 30*a* having a flat under surface 30*b* in sliding contact with the underlying flat surface 28*b* of the base member 20, and it also includes a depending abutment section 30*c* extending into the channel 24 and having an upstanding wall 30*d* coextensive with and substantially parallel to the upstanding wall 24*a* of the base member 22. When assembled on the base member, the planar surface 28*b* underlying the gripping member 30 serves as an actuating incline for urging the leading wall 30*d* of the gripping member, acting by gravity, to slide toward the adjacent parallel wall 24*a* of the base 22. As will subsequently become apparent, the upstanding wall 24*a* serves as a stationary abutment for bearing contact against one face of the semiconductor slice 10, the leading wall 30*d* of the gripping member 30 serving as a movable abutment that is maintained in parallelism with the abutment 24*a*.

The convergent surfaces 28*a*, 30*e* of the base and gripping members 22, 30 are provided with longitudinally spaced transverse sets of delivery troughs 32*a*, 32*b*, each set terminating in the leading edges of these surfaces and having exit ends opening in the abutments 24*a*, 30*d*. These delivery troughs or channels direct appropriate metal pellets to opposite faces of the interposed semiconductor slice 10, and the troughs are related in position, when the pellet sizes are taken into account, to deposit the pellets in substantial coaxial relation. As seen best in Fig. 4, the trough 32*a* is larger in cross-section than the trough 32*b*, since the terminal 12 to be formed at the face of the semiconductor slice 10 adjacent the trough 32*a* is larger than the terminal 14 to be formed adjacent the opposite face of the semiconductor body. As previously pointed out, it is desirable that the input junction be made smaller than the output junction by an amount measured inwardly from the edge of the output junction. This radial difference is indicated by the respective sets of arrows in Fig. 4 and the dimensions $L_1$ and $L_2$. Correspondingly, the pills or pellets that are to form the alloyed junctions are proportioned in relation to each other in accordance with the proportioning of the respective troughs 32*a*, 32*b*, thereby assuring coaxial delivery of the pellets to the opposite faces of the semiconductor slice for subsequent alloying thereto. The pills may be struck or blanked out of sheets of appropriate foil, or they may be molten when deposited in troughs 32*a* and 32*b*. In the present instance the applied material may be indium or gallium, with or without an inactive metal, and capable of imparting P-type properties to the abutting limited areas of the N-type semiconductor slice to be processed.

With the germanium and the metal charges assembled in the composite crucible 20 as shown in Figs. 3 and 4, the entire assembly is placed within an appropriate quartz furnace 40. In this connection, it is to be noted that the bottom wall of the base member 22 is rounded to facilitate support within the generally cylindrical furnace. Thereafter, the temperature of the assembly is raised above that of the melting point of the electrode-forming pills or pellets by resistance radiant-heating or the like, through appropriate coils surrounding the quartz furnace. Heat treatment occurs as the temperature rises sufficiently high to alloy the metal charges with the semiconductor, and is highly effective in the range of 550° to 600° C. for indium as the junction-forming material. Heating is usually maintained for a suitably long period, upward of approximately 90 seconds when employing a semiconductor slice of several thousandths of an inch. It is preferable that a vacuum or reducing atmosphere that is neutral or inert be employed within the furnace to avoid affecting the semiconductor, yet promote efficient engagement of the alloying terminal material with the germanium. In this connection, atmospheres of hydrogen or helium have been found entirely satisfactory. It is desirable to etch the germanium slice prior to heat treatment to promote melting and to avoid generation of contaminating atmospheres during heating. After heat treatment, as indicated, or as a preparatory treatment, an edge of the semiconductor slice 10 is provided with the appropriate ohmic connection 16 to complete the assembly of the junction-type semiconductor unit.

An end stop 34 is provided at each end of member 22 (only one stop 34 being shown) in order to align the ends of base member 22 with the ends of slide member 30, and thereby to insure alignment of passages 32*a* and 32*b* opposite each other. Stop 34 is of graphite, suitably held to base member 22 as by stainless steel screws.

Variations in detail and varied application of the foregoing illustrative disclosure will occur to those skilled in the art, so that it is appropriate that the appended claims should be accorded such broad interpretation as is consistent with the spirit and scope of the invention.

What is claimed is:

1. Apparatus for alloying metal terminals to opposed surfaces of a slice of semiconductor including a base member having a first abutment for engaging a surface of the slice of semiconductor and an actuating incline directed downwardly toward said abutment, and a gripping member resting on said actuating incline and having a further abutment opposite said first abutment for engaging the opposite surface of the slice of semiconductor, said base and gripping members having troughs terminating in the abutments.

2. Apparatus according to claim 1, wherein the cross section of one of said troughs is larger than the cross section of the other of said troughs to bring charges of correspondingly larger and smaller cross section into substantially coaxial relation at opposite faces of the slice of semiconductor.

3. Apparatus according to claim 1 wherein said gripping member includes a slide section having an under surface in sliding contact with said actuating incline and a depending abutment section formed with said further abutment, said depending abutment section extending into a channel way in said base member.

4. Apparatus according to claim 1 wherein the abutment on the base member is formed as one wall of a channel formed in said base member, said channel having a bottom upon which the slice of semiconductor is to be supported edgewise, said one wall being undercut at said bottom.

5. Apparatus for forming rectifying junctions on opposite surfaces of a semiconductor slice by alloying a suitable material to opposite faces of said slice, said apparatus including a crucible having a base member having an upstanding wall, serving as a gripping abutment for one surface of said slice, said base member being formed with downwardly convergent surfaces, one of said surfaces terminating at said wall, and a gripping member in sliding contact with the other surface of said base member and having an upstanding wall in confronting relation to said gripping abutment, said gripping member embodying a passage sloping downwardly toward said gripping abutment, said one surface of the base member having a passage terminating opposite the lower extremity of said sloping passage.

6. Apparatus for forming rectifying junctions on opposite surfaces of a semiconductor slice, including a crucible having a base member and a movable gripping member, said base member having an upstanding wall serving as a gripping abutment for one surface of said slice and having a downwardly sloping passage terminating in a lowermost end at said gripping abutment, said base member being formed with a supporting surface for said movable gripping member which surface slopes downwardly toward said upstanding wall, said gripping member having a gripping surface opposite said upstanding wall, and a passage formed in said gripping member sloping downwardly toward said upstanding wall and terminating in said gripping surface opposite the lowermost end of the first mentioned passage.

7. Apparatus in accordance with claim 6 wherein one of said passages terminates in its abutment below the termination of the other passage in its abutment.

8. Apparatus for forming a multiple-junction semiconductor device including opposed abutments for gripping a slice of the semiconductor, one of said abutments serving as a stationary reference coacting fixed and movable inclined surfaces for gravity actuating the other of said abutments toward said one abutment to firmly grip said slice, means for directing metal pellets by gravity to coaxial positions on opposite sides of said slice for melting while against said slice.

References Cited in the file of this patent

UNITED STATES PATENTS

| | | |
|---|---|---|
| 750,508 | Wherry | Jan. 26, 1904 |
| 2,644,852 | Dunlap | July 7, 1953 |